United States Patent [19]
Gillig et al.

[11] Patent Number: 5,777,521
[45] Date of Patent: Jul. 7, 1998

[54] PARALLEL ACCUMULATOR FRACTIONAL-N FREQUENCY SYNTHESIZER

[75] Inventors: Steven F. Gillig, Roselle; Michael L. Bushman, Hanover Park, both of Ill.

[73] Assignee: Motorola Inc., Schaumburg, Ill.

[21] Appl. No.: 910,000

[22] Filed: Aug. 12, 1997

[51] Int. Cl.$^6$ ............................................. H03L 7/197
[52] U.S. Cl. ................................. 331/16; 331/25; 377/48
[58] Field of Search .......................... 331/16, 25; 377/48

[56] References Cited

U.S. PATENT DOCUMENTS

| | | | |
|---|---|---|---|
| 3,516,007 | 6/1970 | Bos et al. | 331/18 |
| 3,872,397 | 3/1975 | Hanneman | 331/1 A |
| 3,928,813 | 12/1975 | Kingsford-Smith | 331/1 A |
| 4,204,174 | 5/1980 | King | 331/10 |
| 4,609,881 | 9/1986 | Wells | 331/1 A |
| 4,816,774 | 3/1989 | Martin | 331/1 A |
| 4,965,531 | 10/1990 | Riley | 331/1 A |
| 5,070,310 | 12/1991 | Hietala et al. | 331/1 A |
| 5,079,521 | 1/1992 | Gaskell et al. | 331/1 A |
| 5,610,559 | 3/1997 | Dent | 331/2 |

*Primary Examiner*—Siegfried H. Grimm
*Attorney, Agent, or Firm*—Brian M. Mancini; Gary J. Cunningham

[57] ABSTRACT

A frequency synthesizer (10) including a synthesizer loop (12) with a fractional-N divider (14), and including a divider control circuit (18) and a combining circuit (22). The divider control circuit (18) provides a variable divide value (20) to the divider (14). The carry values of two accumulators (24, 26) having differing accumulator lengths are applied in parallel to the combining circuit (22). Each of the accumulators (24, 26) provides a portion of a desired fractional divide value (20). The combining circuit (22) also adds an integer divide value (36) to the fractional divide value (16). By coupling the accumulators (24, 26) in parallel, a high frequency resolution with minimal spurious frequencies is achieved, using a simple, low cost circuit.

23 Claims, 4 Drawing Sheets

PARALLEL ACCUMULATOR FRACTIONAL-N FREQUENCY SYNTHESIZER

FIELD OF THE INVENTION

The present invention relates generally to frequency synthesizers and, in particular, to fractional-N frequency synthesizers incorporating accumulators.

BACKGROUND OF THE INVENTION

Frequency divider circuits are used in frequency synthesizer circuits such as in a phase lock loop (PLL). In a fractional-N synthesis PLL circuit, the output frequency of a voltage controlled oscillator (VCO) is first divided and then applied to a phase detector which operates in a conventional manner comparing the phase of the divided output signal with a reference frequency from a reference oscillator, in order to control the VCO output frequency. The output frequency, $f_o$, is related to the reference frequency, $f_r$, by the relationship: $f_o=f_r(N+F)$ where (N+F) is the effective divisor by which the output frequency is divided before it is compared with the reference frequency. (N+F) is produced by a divider control circuit and consists of an integer part, N, and a fractional part, F. The fraction part, F=k/D where k and D are both integers. Since a divider operates with integer values, fractional division is simulated by switching between different integer values of divisors. However, this switching of the divisors results in spurious frequency sidebands in the synthesizer frequency output.

Standard frequency synthesizer applications in radio communications equipment are only required to step in multiples of the communication channel spacing, typically 5 kHz to 200 kHz depending on the communication systems. More recent innovations, such as illustrated in U.S. Pat. No. 5,604,468, require much finer steps, on the order of 5 Hz to 50 Hz, to allow temperature compensation of the reference oscillator and frequency compensation of the communication device.

Figure 1:
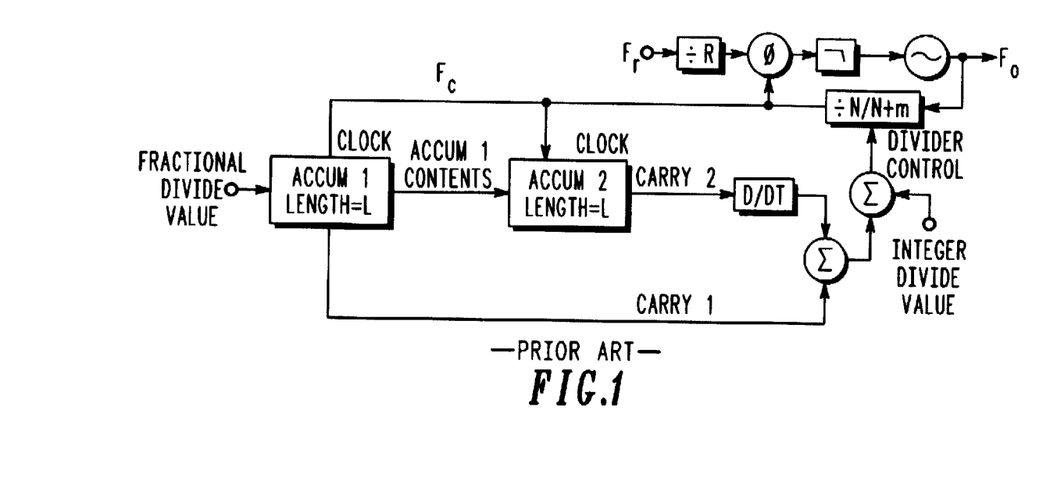
FIG. 1 is a block diagram of a prior art frequency synthesizer using cascaded accumulators.

FIG. 1 shows one approach of providing a high resolution frequency synthesizer. This approach uses cascaded multiple accumulators to control a multi-modulus divider. A single accumulator, ACCUM 1, provides the basic frequency adjustment. This is cascaded with second accumulator, ACCUM 2. The cascaded accumulators act as integrators to process the spurious noise created by the quantization in the other accumulator(s). This approach applies high pass digital filtering to reduce quantization noise. Disadvantageously, ACCUM 1 contains a low frequency quantization signal, hence it can create ground and supply currents at low frequencies. This approach attempts to remove these low frequency currents by digital filtering with the other accumulators. However, once the low frequency quantization signal gets on the ground and supply rails, it has other paths to produce spurious signals via other circuits of an associated integrated circuit (IC) that do not have the desired digital filtering.

Figure 2:
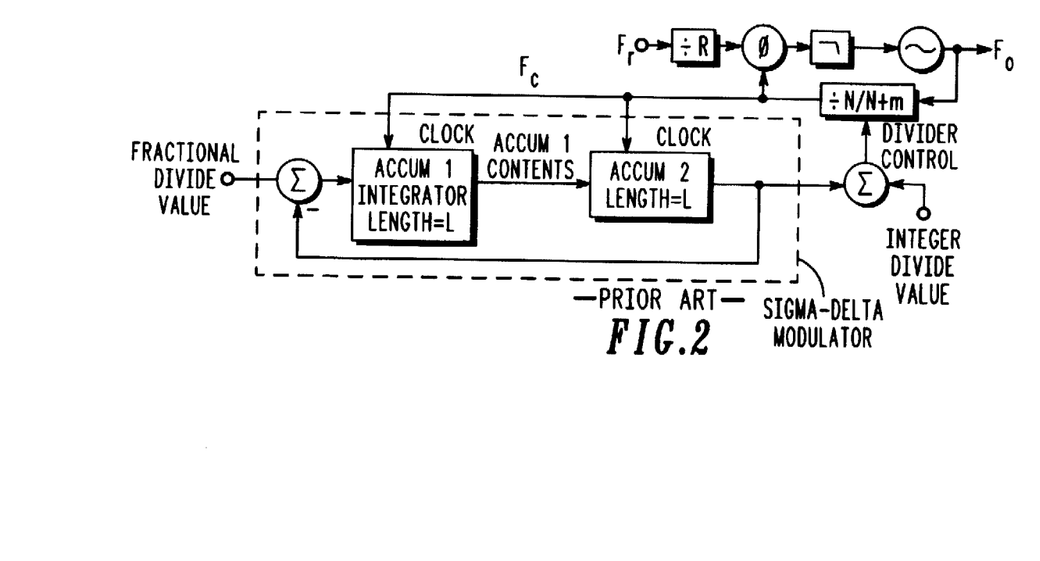
FIG. 2 is a block diagram of a prior art frequency synthesizer using a sigma-delta approach.

FIG. 2 shows the sigma-delta approach to create fractional division. The sigma-delta approach provides similar high pass noise shaping to the cascaded multiple accumulator approach of FIG. 1. A major difference is the use of overall feedback around the cascaded accumulators. For high resolution, it places shaped noise energy across the entire range of frequencies from the minimum resolution frequency up to the accumulator clock frequency. While the noise energy may not contain visibly discrete spurious signals, the total integrated noise energy within a given bandwidth can be quite large and possibly unacceptable for many applications.

The use of cascaded accumulators in the two aforementioned approaches requires large and equal accumulator lengths in all of the accumulators to maintain a large resolution, which is set by the length of the equal-length accumulators. The accumulator length is the ratio of the accumulator clock frequency to the minimum frequency step. For a minimum step size of 10 Hz and a clock frequency of 10 MHz, all of the accumulators must have a length of 1 million, or about 20 bits. However, multiple 20 bit accumulators can constitute the largest silicon area in an integrated high resolution frequency synthesizer.

Figure 3:
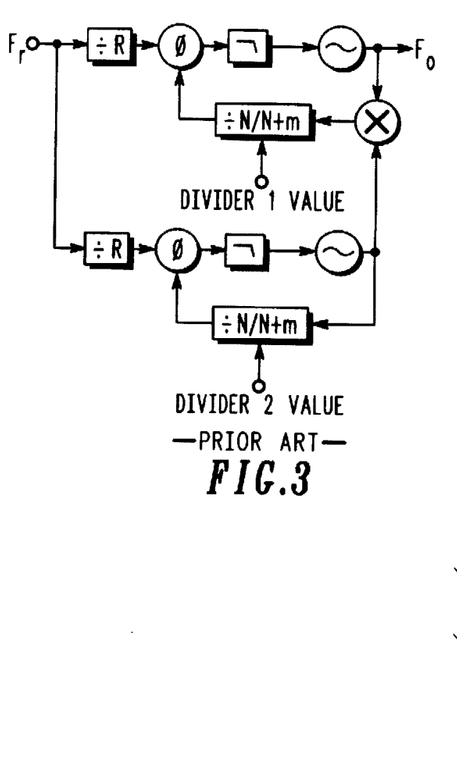
FIG. 3 is a block diagram of a prior art frequency synthesizer using multiple synthesizer loops.

FIG. 3 shows another prior approach which uses multiple synthesizers, mixed together to produce a high resolution multi-loop composite frequency synthesizer. For example, it is known in the art that two frequency synthesizers with slightly different resolutions can be combined in such a way that the generated frequencies mix together to produce much higher resolution than either of the individual frequency synthesizers could produce. For example, two frequency synthesizers with individual resolutions of 10 kHz and 9.99 kHz could be combined to produce a composite frequency synthesizer capable of 0.01 kHz resolution, but having spurious signals in the frequency output at multiples of 10 kHz and 9.99 kHz only, not at multiples of the frequency resolution. By effectively stepping one frequency synthesizer up by 10 kHz and the other down by 9.99 kHz, usually via the divider values in a PLL, the multi-loop composite frequency synthesizer output can be stepped at the difference rate of 0.01 kHz. Spurious signals at the composite output do not appear at multiples of the frequency resolution. They only appear at multiples of the resolution of each individual loop. However, this approach suffers from high circuit complexity due to the need for essentially two complete frequency synthesizers to form a composite high resolution frequency synthesizer. This multi-loop approach also draws much more current then the previously mentioned single-loop PLL frequency synthesizer approaches due to the duplication of circuit blocks.

There is a need for a frequency synthesizer with high resolution that provides low spurious frequency output signals while maintaining fast locktime. To maintain the fast locktime, the loop bandwidth must be on the order of several kHz, orders of magnitude higher than the frequency resolution. However, the levels of the spurious frequency output signals at multiples of the frequency resolution must be kept very low. In addition, the frequency synthesizer must also have low circuit complexity for low cost and low power use.

DETAILED DESCRIPTION OF THE PREFERRED EMBODIMENT

The present invention is a parallel accumulator fraction-N synthesizer using parallel rather than cascaded accumulators to produce high frequency resolution with low circuit complexity and low current drain. The present invention provides low spurious frequency output signals while maintaining fast locktime. In addition, the present invention also utilizes accumulators having different accumulator lengths. However, it should be recognized that accumulators of the same length can be used. In particular, accumulators of the same length, but having different clock frequencies, would perform the same in the present invention as the accumulators of different lengths having the same clock frequency.

The present invention allows the functionality and performance of the high resolution multi-loop composite frequency synthesizer to be achieved without the need for combining two or more separate PLL frequency synthesizers. The present invention achieves this by performing a frequency difference function (mixing) entirely in the digital domain using the carries from the parallel accumulators. The resulting high resolution frequency synthesizer requires only one PLL. It therefore has lower circuit complexity, cost, and current drain than prior art multi-loop frequency synthesizers.

A preferred embodiment of the present invention does not produce high levels of the quantization noise that prior art cascaded accumulator frequency synthesizers create at multiples of the frequency resolution. Therefore, there is no need to shape the quantization noise as is done in the prior art. As such, the present invention does not create high levels of quantization noise power shaped to high frequencies. Therefore, high order loop filtering is not needed to overcome high order noise shaping. The present invention offers better spurious performance at lower frequencies than prior art single accumulator synthesizers while achieving equal frequency resolution for a given total accumulator length and size. Because signals at the frequency resolution do not exist in any of the parallel accumulators, the supply and ground rails, and associated integrated circuitry, are essentially free of low resolution frequency signals, and spurious purity is much easier to achieve on an IC.

The maximum frequency resolution of prior art frequency synthesizers using cascaded accumulators, such as those in FIGS. 1 and 2 for example, is $F_c/L$ where $F_c$ is the clock frequency and L is the length of ACCUM 1. This maximum frequency resolution is much poorer than the present invention given accumulators of similar length, i.e., prior art cascaded accumulators would require much larger accumulator lengths to match the maximum frequency resolution available in the present invention which uses much shorter length accumulators. Larger length accumulators take up more space, power and cost more. In addition, compared to a cascaded two-accumulator fractional division frequency synthesizer, the present invention achieves comparable spurious performance using half of the total accumulator length and size.

Figures 4, 5:
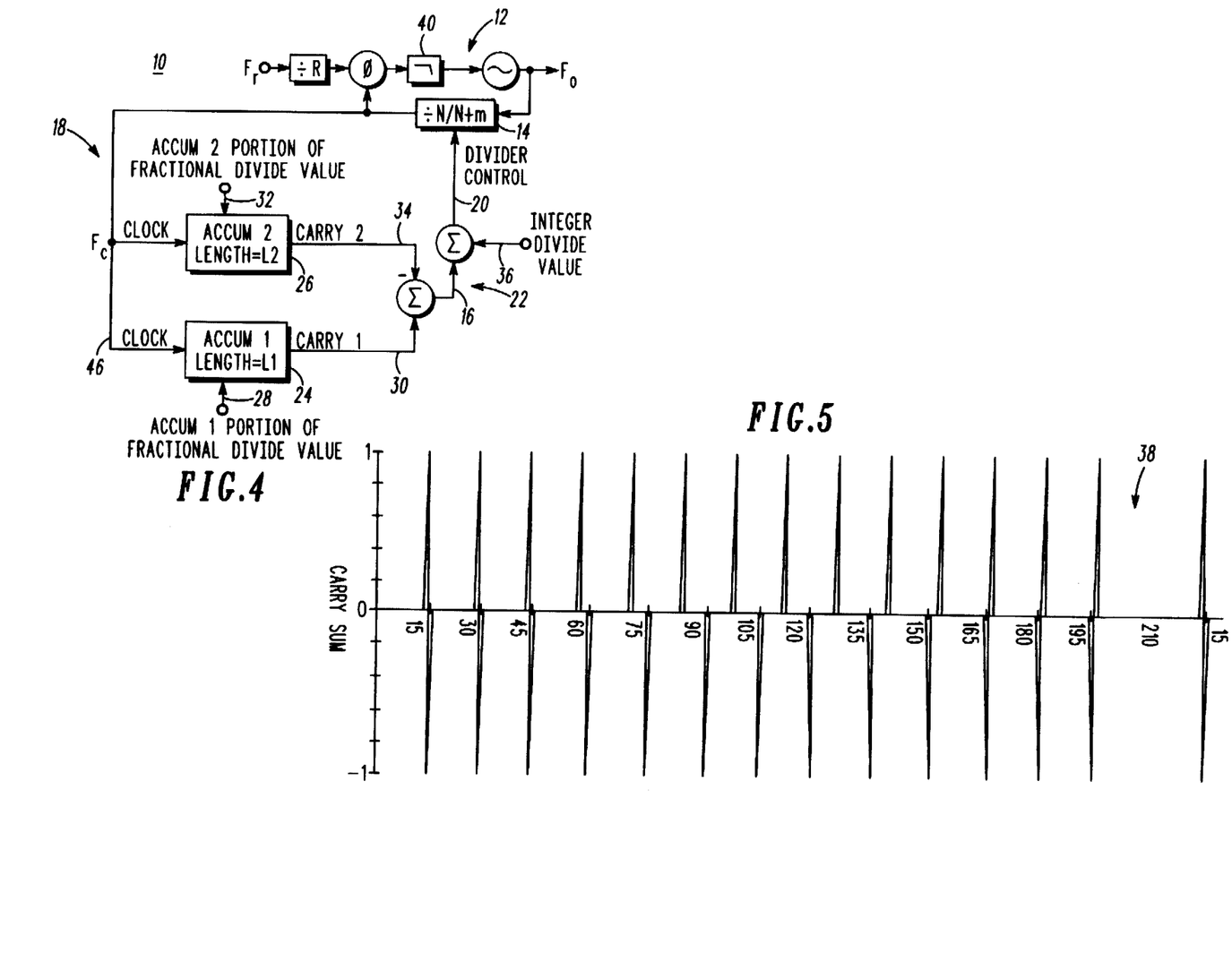
FIG. 4 is a block diagram of a first embodiment of a parallel accumulator fractional-N frequency synthesizer, in accordance with the present invention.
FIG. 5 is a graph of a composite signal showing a summation of the carry waveforms of the parallel accumulators of FIG. 4 versus time, in accordance with the present invention.

FIG. 4 shows a first embodiment of a parallel accumulator fractional-N frequency synthesizer, in accordance with the present invention. A high resolution frequency synthesizer loop 12 including a programmable divider 14. The synthesizer loop 12 can be a phase lock loop, frequency lock loop or delay lock loop configuration as are known in the art. A phase lock loop is preferred. Preferably, the programmable divider 14 is a multi-modulus divider, responsive to a fractional divide value 16.

The frequency synthesizer 10 includes a divider control circuit 18 which provides a divide value 20 to the programmable divider 14. The divider control circuit 18 provides a variable divide value 20 to the programmable divider 14 which results in the divider 14 essentially producing fractional division to obtain a desired high resolution output frequency, $F_o$.

The divider control circuit 18 includes a combining circuit 22 and at least a first and second pulse generator connected in parallel. Preferably, the pulse generators are respective first and second accumulators 24, 26. The first accumulator 24 has an accumulator length of L1 and includes a clock input 46, first accumulator input 28 for receiving data, and a first accumulator output 30 for varying a first portion of the divide value 16 so as to produce a first change in the average value of the divide value 16. The second accumulator 26 has an accumulator length of L2 and includes a clock input 46, a second accumulator input 32 for receiving data and a second accumulator output 34 for varying a second portion of the divide value 16. Preferably, the divide value 16 is a fractional divide value. The first and second outputs 30, 34, which are the respective carries of the accumulators, are combined and coupled to the programmable divider 14 via the combining circuit 22. In this embodiment, the carries are summed using 2's-compliment logic. The combining circuit 22 also adds an integer divide value 36 with the fractional divide value 16 from the accumulators 24, 26 to obtain a summed integer and fractional divide value 20 which is applied to the programmable divider 14.

The maximum frequency resolution of the present invention is the clock frequency, $F_c$, divided by the product of the accumulator lengths, $F_c/(L1 \times L2)$, and occurs where the values of the accumulator lengths differ by one. Each accumulator in the present invention independently contributes to a fractional-N division value of the overall divider value which sets the output frequency of the frequency synthesizer. An average value of individual carry waveforms from each accumulator represents the fractional part of the divider value. By adding (or subtracting) the accumulator carries in such a way that the information from each accumulator carry is preserved in the sum (or difference), the resulting average value is the sum (or difference) of the average values of each of the individual carry waveforms. This operation creates either a sum (or difference) of the individual fractional values represented by each accumulator.

By taking the difference in the accumulator carries, the equivalent of a direct frequency difference mixing is implemented digitally. If a carry from a longer accumulator, ACCUM 2 for example, is subtracted from a carry from a shorter accumulator, ACCUM 1 for example, then the output frequency is $$F_o = \frac{F_r}{R}\left(N + \frac{Num\,1}{L1} - \frac{Num\,2}{L2}\right)$$

where: $F_r$ is the input reference frequency to the loop, R is the reference divider value, N is the integer divide value, Num1 is the numerator of the first portion of the fractional divide value which is input to ACCUM 1, Num2 is the numerator of the second portion of the fraction divide value which is input to ACCUM 2, and L1 and L2 are the lengths of the respective first and second accumulators.

The minimum frequency resolution step size at $F_o$ is $(F_r/R)/(L1 \times L2)$ if L2−L1=1. The major spurious signals in $F_o$ due to the fractional division action of ACCUM 1 occur at frequency multiples of $(F_r/R)/L1$ and those due to ACCUM 2 occur at frequency multiples of $(F_r/R)/L2$. Below these frequencies, no spurious signals or quantization noise is created by the fraction division action due to each individual accumulator even though a frequency resolution is achieved that is approximately L1 times lower in frequency. However, it should be recognized that intermodulation products appear at multiples of the frequency resolution due to the non-linear action of the programmable divider 14. Additionally, other non-linear components exist in the frequency synthesizer, for example the phase detector, which can contribute to intermodulation products.

FIG. 5 shows the carry waveforms for L1=14, L2=15 and Num1=Num2=1 when the carry of the second accumulator is directly subtracted from the carry of the first accumulator. A carry sum of +1 is generated every fourteen accumulator clock cycles due to ACCUM 1, and a carry sum of −1 is generated every fifteen clock cycles due to ACCUM2. Note that the composite carry waveform repeats every 210 accumulator clock cycles, indicating a resolution of 1/210 versus an individual resolution of 1/14 in the first accumulator and 1/15 in the second accumulator. In this embodiment, the carries from the two accumulators cancel every 210 accumulator clock cycles.

Figure 6:
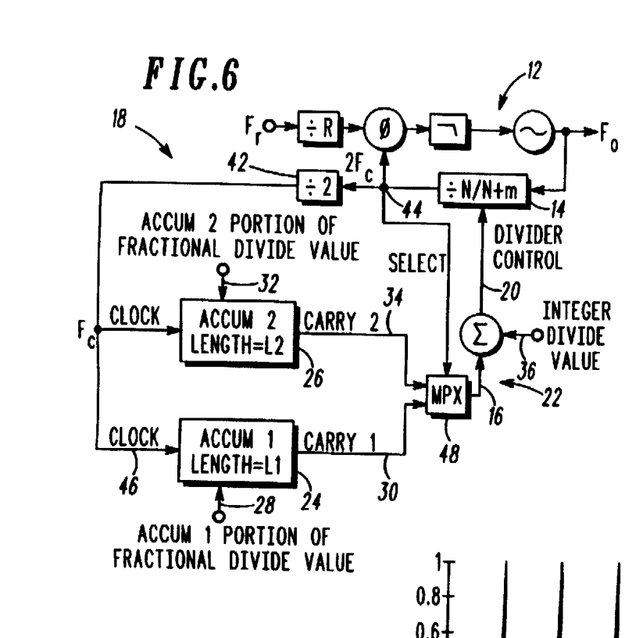
FIG. 6 is a block diagram of a preferred embodiment of a parallel accumulator fractional-N frequency synthesizer, in accordance with the present invention.

FIG. 6 shows a preferred embodiment of the present invention that includes multiplexing the carries of the parallel accumulators of FIG. 4. The description of FIG. 4 is hereby incorporated by reference. The preferred embodiment includes a divider 42 coupled to an output 44 of the programmable divider 14. The divider 42 divides the output by at least the number of accumulators, in this case two, and applies the divided accumulator clock signal, $F_C$, to the clock inputs 46 of the accumulators 24, 26. The combining circuit 22 includes a multiplexer 48, MPX, which multiplexes the outputs 30, 34 of the accumulators 24, 26, alternating between the carries of the respective accumulators at a rate of the frequency output 44 from the divider 14. It should be noted that the frequency output 44 from the divider can be increased over that of the embodiment of FIG. 4 so that the accumulator clock frequency, $F_C$, remains the same. Frequency output 44 can be increased because the use of a multiplexer 48 doubles the effective resolution for two accumulators. However, the range of fractions that can be implemented in the value of the programmable divider 14 are reduced because the maximum change due to each individual accumulator is now halved. In particular, the frequency output 44 has been multiplied by the number of accumulators, in this case two.

A select signal for controlling the multiplexer 48 is coupled from the output 44 branch of the programmable divider to the multiplexer 48. In this embodiment, the pulse that was previously missing at 210 accumulator clock cycles (38 as shown in FIG. 5) is no longer missing since the multiplexer 48 is only monitoring one of the accumulators at a time, instead of subtracting carries as was done for the embodiment of FIG. 4.

Figure 7:
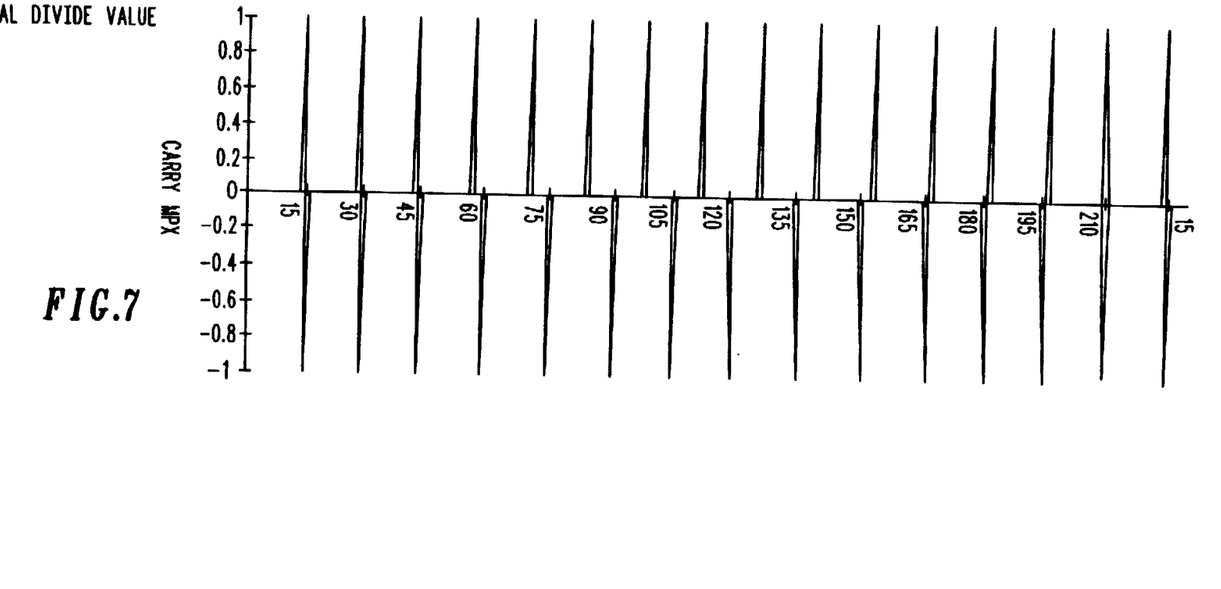
FIG. 7 is a graph of a composite signal showing a multiplex function of the carry waveforms of the parallel accumulators of FIG. 6 versus time, in accordance with the present invention.

FIG. 7 shows the carry waveforms for L1=14, L2=15 and Num1=Num2=1 when the carry of the second accumulator is multiplexed with the carry of the first accumulator. Note that the composite carry waveform repeats every 210 accumulator clock cycles (420 divider cycles), indicating a resolution of 1/210 versus an individual resolution of 1/14 in the first accumulator and 1/15 in the second accumulator. In this embodiment, the carries from the two accumulators do not cancel every 210 accumulator clock cycles (shown as 38 in FIG. 5). The result is that spurious signals in the synthesizer output frequency at multiples of the frequency resolution are reduced relative to the carry summing implementation of FIG. 4 and the carry sum waveform of FIG. 5.

Figure 8:
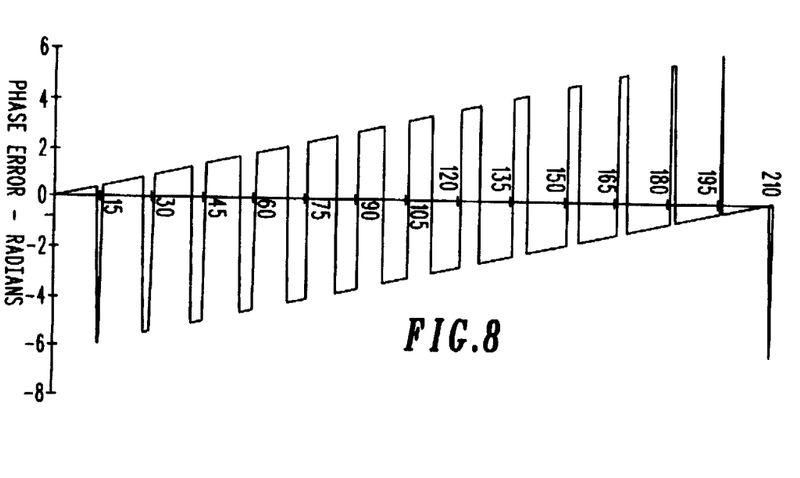
FIG. 8 is a graph of a phase error associated with the carry waveforms of the parallel accumulators of FIG. 6 versus time, in accordance with the present invention.

FIG. 8 shows a graph of a phase error associated with the carry waveforms of the parallel accumulators of FIG. 6 versus accumulator clock cycles. The graph shows a ramp-like signal. As is known in the art, the phase error produced by a single accumulator produces a straight ramp signal which has a period equal to the accumulator length, for example 210 clock cycles. This generates spurious signals at fundamentals and harmonics of the ramp frequency. However, this preferred embodiment of the present invention advantageously has a ramp-like signal composed of segments of much shorter periods. In addition, each of these shorter periods is a different length than the others. This produces spurious products that are higher in level at the higher frequency of the individual carry signals and lower in level at the lower frequency associated with the overall synthesizer resolution. These higher frequency spurious signals can be easily filtered out. Surprisingly, this preferred embodiment produces very little energy at the frequency represented by the overall synthesizer resolution. This is in contrast to a single accumulator which produces its highest spurious products at its fundamental period, which corresponds directly to the resulting synthesizer resolution.

Programming the novel 2-accumulator parallel accumulator synthesizer is similar in some ways to programming the prior art 2-loop synthesizer of FIG. 3. However, the present invention also has some unique properties which need to be considered in its programming because there are not really 2 loops. In the 2-accumulator parallel accumulator synthesizer, each accumulator represents a pseudo-loop. As such, each pseudo-loop steps many large steps even though the resulting difference resolution is small. As an accumulator's programming value increases it will eventually roll over and the roll over must be tracked. A roll over occurs when the programming value of an accumulator changes from a value of less than its length to a value equal or greater than its length. Roll over can be accounted for with a change in the integer value, N, of the programmable divider either up or down. When the accumulator which adds to the programmable divider value rolls over, the roll over is accounted for by increasing the integer value of the programmable divider. Similarly, when the accumulator which subtracts from the programmable divider value rolls over, the roll over is accounted for by decreasing the integer value of the programmable divider. As the accumulators alternately roll over, the net roll over is tracked and accounted for accordingly in the integer value of the programmable divider. The accumulators will always alternate rolling over, so that the net roll over is never more than one.

By way of example, let L1=14 and L2=15 as described previously for FIG. 4. When Num1=0 and Num2=0, the programmable divider 14 will be continuously dividing by an integer value. Fractional divide value 16 will be zero. To step the synthesizer output frequency incrementally by the resolution, each accumulator numerator is stepped by one. The fractional divide value 16 will step on average by $((1/14)-(1/15))=1/210$ until eventually Num1=13 and Num2=13. On the next increment of the accumulator numerators, ACCUM1 will roll over to zero and the roll over must be tracked by incrementing the programmable divider 14 by one, which is implemented by incrementing the integer divide value 36 by one. At this point Num1=0 and Num2=14 and the net change relative to the Num1=Num2=0 starting point is $1+9/14-14/15=1/15$. Once again incrementing both accumulator numerators by one results in Num1=1 and ACCUM2 rolling over. When ACCUM2 rolls over, the net roll over changes from one back to zero. The net change relative to the Num1=Num2=0 starting point is now $1-1+1/14-9/15=1/14$.

Programming the novel 2-accumulator parallel accumulator synthesizer of FIG. 4 follows the general procedure outlined below. The N+1, N, N−1 carry sum of FIG. 5 is assumed. In other words, ACCUM1 is assumed to increase the instantaneous value of the programmable divider 14 by one each time it produces a carry output and ACCUM2 is assumed to decrease the instantaneous value of the programmable divider 14 by one each time it produces a carry output.

For the embodiment shown in FIG. 4, the parallel accumulators are programmed using instantaneous values of the programmable divider 14 equal to N+1, N, and N−1, where L1 is the length of ACCUM1 and L2 is the length of ACCUM2, and following the steps below.

Step 1: Determine the value of the programmable divider 14 needed to synthesize the desired output frequency $F_0$. It will have an integer part, N, and a fractional part, F.

Step 2: For reference, calculate the number of steps at the minimum resolution step size needed to realize the fractional part, F. This will be $$F \times L1 \times L2$$

Step 3: Calculate the number of rollovers of ACCUM1, RO1, needed to realize the fractional part, F. RO1 equals the integer part of $((F \times L1 \times L2)/L1)$ which equals the integer part of $(F \times L2)$.

Step 4: Calculate the number of rollovers of ACCUM2, RO2, needed to realize the fractional part, F. RO2 equals the integer part of $((F \times L1 \times L2)/L2)$ which equals the integer part of $(F \times L1)$.

Step 5: The net rollover is RO1−RO2, which equals (the integer part of $(F \times L2)$)−(the integer part of $(F \times L1)$).

Step 6: The numerator of ACCUM1, Num1, is $$Num1 = L1 \times (\text{the fractional part of } (F \times L2))$$

where (the fractional part of $(F \times L2)$) represents the fractional contribution of ACCUM1 after the rollovers.

Step 7: The numerator of ACCUM2, Num2, is $$Num2 = L2 \times (\text{the fractional part of } (F \times L1))$$

where (the fractional part of $(F \times L1)$) represents the fractional contribution of ACCUM2 after the rollovers.

In summary, the average value of the programmable divider 14, N+F, is $$N+F = N + RO1 - RO2 + Num1/L1 - Num2/L2$$

where
RO1−RO2=(the integer part of $(F \times L2)$)−(the integer part of $(F \times L1)$)
Num1=L1×(the fractional part of $(F \times L2)$)
Num2=L2×(the fractional part of $(F \times L1)$)

When F=Numerator/(L1×L2) such that the fraction can be expressed directly in terms of the two accumulator lengths, the equations simplify to
RO1−RO2=(the integer part of (Numerator/L1))−(the integer part of (Numerator/L2)),
Num1=L1×(the fractional part of (Numerator/L1)) and
Num2=L2×(the fractional part of (Numerator/L2))

For example, let $N+F=100+99/210$ and L1=14, L2=15. Then
RO1−RO2=(the integer part of (Numerator/L1))−(the integer part of (Numerator/L2))=(the integer part of $(99/14)$)−(the integer part of $(99/15)$)=7−6=1,
Num1=L1×(the fractional part of (Numerator/L1))=14× (the fractional part of $(99/14)$)=1
and
Num2=L2×(the fractional part of (Numerator/L2))=15× (the fractional part of $(99/15)$)=9
Therefore $$N+F = 100+99/210 = 101+1/14-9/15.$$

If the fraction is known in decimal form only, as for example 150+0.278, then by way of example
RO1−RO2=(the integer part of $(0.278 \times 15)$)−(the integer part of $(0.278 \times 14)$)=4−3=1,
Num1=L1×(the fractional part of $(0.278 \times 15)$)=2.38 and
Num2=L2×(the fractional part of $(0.278 \times 14)$)=13.38
Therefore $$N+F = 150+0.278 = 151+2/14-13/15 + Error$$

where Error=−0.0018095. The Error will always be less in magnitude than one-half the minimum resolution, which in this case is $1/420=0.002381$.

For the present invention implemented with a multiplexer as shown in FIG. 6, using instantaneous values of the programmable divider 14 equal to N+1, N, and N−1, programming is essentially identical to the steps just presented for FIG. 4. However, for the exact same equations to apply a couple of different scenarios must be considered. If the frequency of the divider output 44 is kept the same as in the FIG. 4 implementation, then the instantaneous values of the programmable divider 14 must be made equal to N+2, N, and N−2. This increase in the divide step size also corrects for a loss of range that would otherwise be suffered. Using N+1, N, N−1, would otherwise result in each accumulator only being able to pull the average value of the divide by slightly less than ½. Using N+2, N, and N−2 also reverses the factor of 2 increase in resolution that is a result of the multiplexing of the ACCUM1 and ACCUM2 carries. The use of N+1, N, and N−1 would result in frequency dead spaces that could not be realized in a general continuous frequency scheme. However, it could be used in certain situations in which, for example, only a limited range is required.

Alternately, if the present invention implemented with a multiplexer as shown in FIG. 6 is implemented by increasing the frequency of the divider output 44 by two relative to its value used in the FIG. 4 implementation, then simply recalculate the N+F of the programmable divider 14 and apply all of the comments presented for the last case described. The use of N+2, N, and N−2 is still needed to realize a continuous frequency scheme across changes in N.

There is another scheme that can be used with the invention of FIG. 4 instead of the N+1, N, N−1 scheme for sum combining (or N+2, N, and N−2 scheme for multiplex combining). The alternate scheme is to use only N+1 and N−1 and divide by N+1 and then N−1 on alternate cycles of the divider output 44. When both carries are zero, alternate dividing between N+1 and N−1. When the ACCUM1 carry equals 1, divide by N+1 instead of N−1 for one cycle of the divider output and when the ACCUM2 carry equals 1, divide by N−1 instead of N+1 for one cycle of the divider output. When both carries equal 1, continue dividing as though both equal zero because they cancel.

In some circumstances it may be advantageous to work with a dual-modulus divider. For these cases, the N+1, N−1 scheme just described can be modified. Programmable divider 14 can be implemented as a dual-modulus divider which divides between N+1 and N. However, the entire frequency region that would appear to be available as programmable divider 14 moves between an average value of N and an average value of N+1 is not available. Average divide values close to N and close to N+1 are not available. In general, average divide values closer to N or N+1 than the resolution of each individual accumulator are not available. This is not a particular problem but must be understood to avoid an unavailable region of operation.

The previous programming discussion assumes that the accumulator lengths, L1 and L2, are known. However, for each application the accumulator lengths must first be determined from the required resolution and the master reference oscillator frequency. The goal in determining L1 and L2 is to place the spurious signal generated by each individual accumulator carry as high in frequency as possible, to allow easier removal by the loop filter, and simultaneously provide the required final resolution from the parallel accumulator action.

As an example, L1 and L2 can be determined for an application requiring a 30 kHz resolution and using a 19.68 MHz master reference oscillator frequency. First, the 19.68 MHz master reference oscillator frequency is divided by the desired 30 kHz resolution to get a required ratio, 656. Factor this ratio to get 656=16×41. Accumulator lengths of L1=16 and L2=41 will not provide the required resolution, since $1/16 - 1/41 = 25/656$ and a resolution of $1/656$ is desired. The desired resolution in this case cannot be achieved using this simplistic approach. However, there is a procedure to ensure that the resulting spurious signals from the accumulator carries are placed as high in frequency as possible. In fact, a 30 kHz resolution can be achieved with further investigation.

Submultiples of the desired resolution are evaluated to see if an appropriate submultiple of 30 kHz exists which would result in an L1 and L2 which are close in value, preferably within 1 or 2 of each other. This would give slightly higher resolution than needed. However, the numerators of each accumulator can then be stepped in larger steps to produce the desired resolution. In many cases, a reduction in the fraction of one of the accumulators will push the frequency of the spurious signal generated by this accumulator's carry out to a higher frequency while at the same time pushing the spurious signal due to the parallel accumulator resolution out in frequency also.

The general procedure for determining L1 and L2 to the application requiring a 30 kHz resolution and using a 19.68 MHz master reference oscillator frequency can now be applied. It was found that 19.68 Mhz/30 kHz=656=16×41. This does not provide the required resolution, since $1/16 - 1/41 = 25/656$ and a resolution of $1/656$ is desired. The submultiples of the desired resolution are evaluated to see if an appropriate submultiple exists which would result in an L1 and L2 which are close in value, preferably within 1 or 2 of each other. The next submultiple is 15 kHz, which results in 19.68 MHz/15 kHz=1312=32×41. However, $1/32 - 1/41$ is approximately $1/145$ which is insufficient resolution. Trying the next submultiple, 10 kHz, results in 19.68 MHz/10 kHz=1968=48×41. However, $1/41 - 1/48$ is approximately $1/281$ which is insufficient resolution. Trying the next submultiple, 7.5 kHz, produces 19.68 MHz/7.5 kHz=2624=64×41. however, $1/41 - 1/64$ is approximately $1/114$ which is insufficient resolution. This procedure is followed until the appropriate resolution is achieved.

It is desired to find a factor of 19.68 MHz, of about 40, to go with the factor of 41. Moving to the next 30 kHz submultiple, 6 kHz, results in 19.68 Mhz/6 kHz=3280=2× 40×41. The master reference oscillator frequency, 19.68 MHz, can be divided by 2 to get a 9.84 MHz reference for the loop and use accumulator lengths of L1=40 and L2=41. Since the resolution is 6 kHz instead of the desired 30 kHz, the accumulator programming can be stepped in multiples of 5 to produce 5×6 kHz=30 kHz steps. When the numerator of the fraction produced by ACCUM1 is stepped by 5, its fraction reduces from 5n/40 to n/8, where n=0, 1, ... 7. The fraction takes on values of 0, $1/8$, $2/8$, ... $7/8$.

The lowest spurious frequency generated by the carry of ACCUM1 is 9.84 MHz/8=1.23 MHz. When ACCUM2, with length L2=41, is stepped by 5, it cannot be reduced further. The fraction will take on all of the values 0, $1/41$, $2/41$, ... $40/41$ as 41 steps of 5 are needed to complete a cycle of frequency stepping. The lowest spurious frequency generated by the carry of ACCUM2 is 9.84 MHz/41=240 kHz which occurs when the numerator is 1 and the fraction is $1/41$ and also when the numerator is 40 and the fraction is $40/41$. Of course, spurious signals will also occur at the 30 kHz resolution frequency and its multiples since the effects of the two parallel accumulators are not independent, resulting in the generation of spurious intermodulation signals when they jointly control the programmable loop divider. However, spurious signals will not appear at 6 kHz because the fraction represented in ACCUM1 was reduced from multiples of $1/41$ to multiples of $1/8$.

The lowest intermodulation frequency will be 30 kHz, which will be present when the ACCUM1 numerator is 1 or 7, so that its carry frequency is 1.23 MHz, while at the same time the ACCUM2 carry has energy at 1.2 MHz. The ACCUM2 carry will have energy at 1.2 MHz either due to a fundamental frequency in the carry signal when the fraction is $5/41$ or due to a harmonic of the fundamental frequency in the carry signal when the fraction is $1/41$, for example. These are worst case examples. At some output frequencies of the PLL frequency synthesizer there will not be low frequency spurious signals at all. This will be the case whenever only one of the accumulators' carries is active, such as when the other accumulator is programmed to zero.

In the preceding analysis, the accumulator carries were assumed to be combined by summation and the programmable loop divider nominal value of N programmed to N+1 in response to a carry in ACCUM1 and to N−1 in response to a carry in ACCUM2. A divide-by-2 was used to create a 9.84 MHz reference frequency for the PLL from the 19.68 MHz reference oscillator and to clock the accumulators of length L1=40 and L2=41. Alternately, a multiplex combining of the accumulator carries can be used, as represented in FIG. 6. Using multiplex combining of the carries, the reference frequency for the PLL remains at 9.84 MHz while a divide-by-2 is used to create a 4.92 MHz clock, $F_C$, to the accumulators. The accumulator carries are multiplexed using the 9.84 MHz reference.

A programmable loop divider nominal value of N is created from the average of N+1 and N−1 with a 50% duty cycle at each value when there are no accumulator carries.

When ACCUM2 carries, one N+1 cycle is changed to N−1 and when ACCUM1 carries, one N−1 cycle is changed to N+1. The step of magnitude 2 in the programmable loop divider value in response to an accumulator carry allows all frequencies to be continuous addressed. It also erases the resolution increase that would have resulted from the multiplex procedure. A one count static increase in the programmable loop divider value is still needed whenever the net rollover of the accumulators dictates, as explained earlier. The final resolution is 9.84 MHz/($5/40−5/41$)=30 kHz when the accumulator numerators are stepped by 5 instead of by 1.

By example, for a GSM application requiring 200 kHz resolution from a 13 MHz reference oscillator, the optimum accumulator lengths can be found to be L1=25 and L2=26 using a PLL reference frequency of 13 MHz. These will produce 20 kHz resolution if the accumulators are stepped by one count. Stepping the accumulators instead by ten counts will produce the desired 200 kHz resolution. The fractions reduce to 10n/25=2n/5 for ACCUM1 and to 10n/26=5n/13 for ACCUM2. The spurious signals due to the individual accumulators will then be at multiples of 13 MHz/5=2.6 MHz and 13 MHz/13=1 MHz, respectively. Each step of ten counts in the ACCUM1 numerator with L1=25 would produce 5.2 MHz frequency steps and each step of ten counts in the ACCUM2 numerator with L2=26 would result in 5 MHz frequency steps. When combined, the resulting difference provides the required 200 kHz resolution.

For the GSM application requiring 200 kHz resolution from a 13 MHz reference oscillator and using a PLL reference frequency of 13 MHz. Let N+F=N+$13/65$. Then RO1−RO2=(the integer part of ($13/65×26$))−(the integer part of ($13/65×25$))=4−4=0

Num1=25×(the fractional part of ($13/65×26$))=20 and
Num2=26×(the fractional part of ($13/65×25$))=16
Therefore, N+$13/65$=N+$20/25$−$16/26$.

Other schemes for combining the accumulator carries are possible. For example, they could be directly added to produce an N, N+1, and N+2 scheme. Programming for this scheme would be somewhat more difficult than for the carry differencing scheme which uses N−1, N, and N+1, but the overall synthesizer performance would be the same.

The basic parallel accumulator fractional-N technique can be extended. For example, in a case of using three accumulators, the resolution can be made proportional to 1/(L1×L2×L3). Also, techniques such as cascaded multi-accumulator fractional-N and sigma-delta fractional-N noise shaping techniques can be linked with the parallel accumulator fractional-N technique of the present invention to produce better performance than the parallel accumulator fractional-N technique alone. For example, each single parallel accumulator could be replaced with a cascaded accumulator structure of the multi-accumulator fractional-N or sigma-delta fractional-N variety as are known in the art. Moreover, in a general implementation of the present invention, the accumulators can be replaced with pulse generators of an arbitrary nature, including pulse generators with pseudo-random properties, or the accumulators could be replaced directly with an existing microprocessor for generating pulses.

Figure 9:
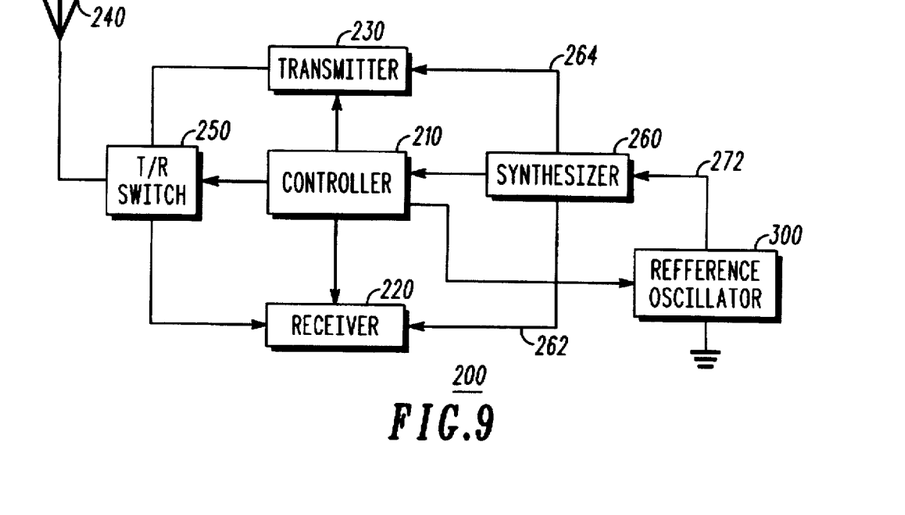
FIG. 9 shows a block diagram of a communication device which includes a high resolution frequency synthesizer, in accordance with the present invention.

FIG. 9 shows a block diagram of a communication device 200 which includes a frequency synthesizer 260 which contains a divider control circuit, in accordance with the present invention. In one embodiment, the communication device 200 is a transceiver. The communication device 200 comprises a frequency synthesized two-way transceiver which operates under the control of a microcontroller 210.

The communication device 200 includes a receiver 220 and a transmitter 230 which receive and transmit RF via an antenna 240. The antenna 240 is appropriately switched between the receiver 220 and the transmitter 230 by an antenna switch 250, or alternatively by a duplexor. A reference oscillator 300 provides a reference oscillator signal 272 for the frequency synthesizer 260. The frequency synthesizer 260 provides a receiver local oscillator signal 262 and transmitter local oscillator signal 264. The frequency synthesizer 260 contains a high resolution frequency synthesizer utilizing the principles of the present invention.

Figure 10:
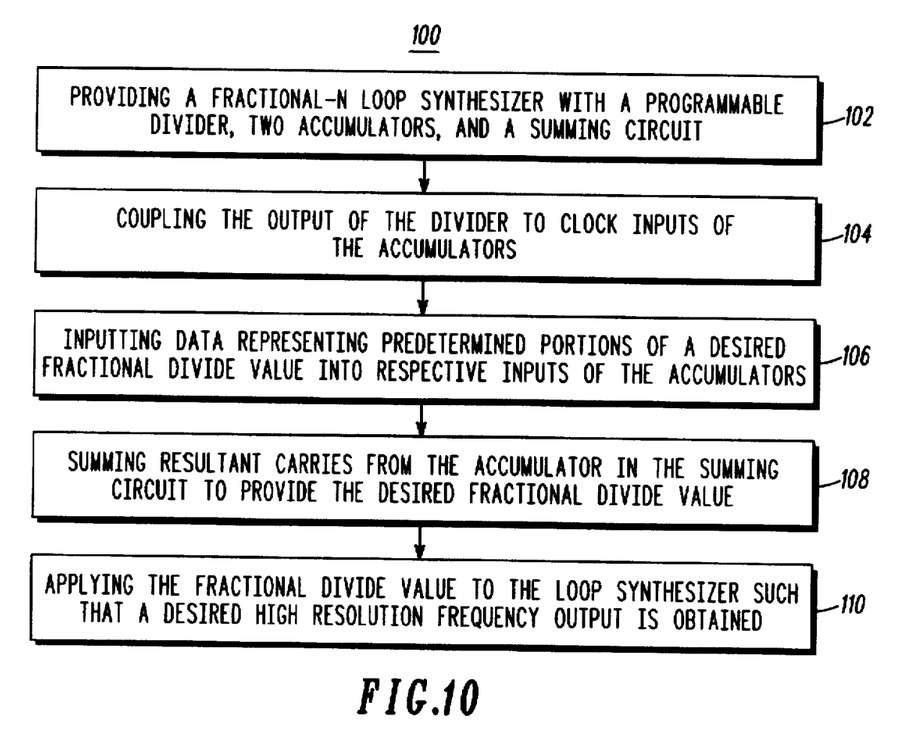
FIG. 10 is a flow diagram of a method to provide high resolution synthesized frequencies, in accordance with the present invention.

FIG. 10 shows a flow diagram of a method 100 for providing high resolution synthesized frequencies The method includes a first step 102 of providing a fractional-N loop synthesizer with a divider having an output coupled with at least two accumulators with clock inputs, inputs and outputs and having different accumulator lengths and a combining circuit. A second step 104 includes coupling the output of the divider to the clock inputs of the accumulators. A third step 106 includes inputting data representing predetermined portions of a desired fractional divide value into the respective inputs of the accumulators. A fourth step 108 includes combining resultant carries from the outputs of the accumulator in the combining circuit to provide the desired fractional divide value. A last step 110 includes applying the fractional divide value to the loop synthesizer such that a desired high resolution frequency output is obtained.

In one embodiment, the providing step includes the divider being a multi-modulus divider responsive to the fractional divide value, and wherein the inputting step includes the respective accumulator outputs being responsive to associated portions of the fractional divide value.

In a preferred embodiment, the combining step includes summing an integer divide value with the fractional divide value to obtained a combined integer and fractional divide value, and wherein the applying step includes applying the summed integer and fractional divide value to the divider.

In a more preferred embodiment, the providing step includes the combining circuit having a multiplexer which multiplexes the outputs of the accumulators, a control signal for the multiplexer being coupled from an output of the programmable divider, and further comprising a dividing step wherein the output of the divider to the clock inputs of the accumulators is divided by the total number of accumulators.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A frequency synthesizer, comprising:

a synthesizer loop including a programmable divider;

a divider control circuit providing a divider value to the programmable divider, the divider control circuit providing a variable divide value to the programmable divider for fractional division to produce a desired output frequency, and including a combining circuit and at least a first and second pulse generator connected in parallel;

the first pulse generator including a first output for varying a first portion of the divide value to produce a first change in an average of the divide value;

the second pulse generator including a second output for varying a second portion of the divide value to produce a second change in the average of the divide value; and the first and second outputs being combined and coupled to the programmable divider via the combining circuit.

2. The frequency synthesizer of claim 1, wherein the programmable divider is responsive to a fractional divide value, and wherein the first and second pulse generator outputs vary respective first and second portions of the fractional divide value.

3. The frequency synthesizer of claim 2, wherein the combining circuit adds an integer divide value with the fractional divide value to obtained an integer and fractional divide value, and applies the integer and fractional divide value to the programmable divider.

4. The frequency synthesizer of claim 1, wherein the pulse generators are selected from at least one of the group consisting of pulse generators with pseudo-random properties, accumulators, fractional-N cascaded multi-accumulators, fractional-N sigma-delta cascaded multi-accumulators, and microprocessors.

5. The frequency synthesizer of claim 4, wherein the pulse generators are accumulators having respective first and second inputs for receiving data.

6. The frequency synthesizer of claim 5, wherein the accumulators have the same lengths with each accumulator being driven by different clock frequencies.

7. The frequency synthesizer of claim 5, wherein the accumulators have different accumulator lengths.

8. The frequency synthesizer of claim 5, wherein the first and second outputs are respective carries of the first and second accumulators.

9. The frequency synthesizer of claim 8, wherein the carries are summed in the combining circuit.

10. The frequency synthesizer of claim 8, wherein the combining circuit includes a multiplexer which multiplexes the carries of the accumulators, a control signal for the multiplexer being coupled from an output of the programmable divider, a clock frequency is derived from an output of the programmable divider and applied to clock inputs of the at least first and second accumulators.

11. A high resolution frequency synthesizer, comprising:

a synthesizer loop including a programmable fractional-N divider;

a divider control circuit providing a divider value to the programmable divider, the divider control circuit providing a variable divide value to the programmable divider for fractional division to produce a desired output frequency, and including a combining circuit and at least a first and second accumulator connected in parallel;

the first accumulator having a first accumulator length and including a clock input, a first input for receiving data and a first output for increasing a first portion of the fractional divide value to produce a first change in an average of the fractional divide value;

the second accumulator having a second accumulator length different from the first accumulator length and including a clock input, a second input for receiving data and a second output for decreasing a second portion of the fractional divide value to produce a second change in the average of the fractional divide value; and the first and second outputs being combined and coupled to the programmable divider via the combining circuit to produce a combined change in the average of the fractional divide value.

12. The frequency synthesizer of claim 11, wherein the combining circuit adds an integer divide value with the fractional divide value to obtained an integer and fractional divide value, and applies the integer and fractional divide value to the programmable divider.

13. The frequency synthesizer of claim 11, wherein the first and second outputs are respective carries of the first and second accumulators, the carries being combined in the combining circuit.

14. The frequency synthesizer of claim 11, wherein the combining circuit includes a multiplexer which multiplexes the outputs of the accumulators, a control signal for the multiplexer being coupled from an output of the programmable divider, a clock frequency is derived from an output of the programmable divider and is divided by at least the total number of accumulators and applied to the clock inputs of the at least first and second accumulators.

15. A radio communication device having at least one of a transmitter and a receiver and having a frequency synthesizer, comprising:

a synthesizer loop including a programmable divider;

a divider control circuit providing a divider value to the programmable divider, the divider control circuit providing a variable divide value to the programmable divider for fractional division to produce a desired output frequency, and including a combining circuit and at least a first and second accumulator;

the first accumulator including a first input for receiving data and a first output for varying a first portion of the divide value to produce a first change in an average of the divide value;

the second accumulator including a second input for receiving data and a second output for varying a second portion of the divide value to produce a second change in the average of the divide value; and the first and second outputs being combined and coupled to the programmable divider via the combining circuit.

16. The radio communication device of claim 15, wherein the frequency synthesizer includes accumulators having different accumulator lengths, and wherein the frequency synthesizer includes the programmable divider being responsive to a fractional divide value, and wherein the first and second accumulator outputs vary respective first and second portions of the fractional divide value.

17. The radio communication device of claim 16, wherein the frequency synthesizer combining circuit adds an integer divide value with the fractional divide value to obtained an integer and fractional divide value, and applies the integer and fractional divide value to the programmable divider.

18. The radio communication device of claim 16, wherein the first and second outputs are respective carries of the first and second accumulators, the carries being summed in the combining circuit.

19. The radio communication device of claim 16, wherein the frequency synthesizer combining circuit includes a multiplexer which multiplexes the outputs of the accumulators, a control signal for the multiplexer being coupled from an output of the programmable divider, a clock frequency is derived from an output of the programmable divider and applied to clock inputs of the at least first and second accumulators.

20. A method for providing high resolution synthesized frequencies, comprising the steps of:

providing a fractional-N loop synthesizer with a programmable divider having an output coupled with at least two accumulators having clock inputs, accumulator inputs and accumulator outputs and having different accumulator lengths and a combining circuit;

coupling the output of the divider to the clock inputs of the accumulators;

inputting data representing predetermined portions of a desired fractional divide value into the respective inputs of the accumulators;

combining resultant carries from the outputs of the accumulators in the combining circuit to provide the desired fractional divide value; and applying the fractional divide value to the loop synthesizer such that a desired high resolution frequency output is obtained.

21. The method of claim 20, wherein the providing step includes the divider being responsive to the fractional divide value, and wherein the inputting step includes the respective accumulator outputs being responsive to associated portions of the fractional divide value.

22. The method of claim 20, wherein the combining step includes combining an integer divide value with the fractional divide value to obtained a summed integer and fractional divide value, and wherein the applying step includes applying the summed integer and fractional divide value to the divider.

23. The method of claim 22, wherein the providing step includes the combining circuit having a multiplexer which multiplexes the outputs of the accumulators, a control signal for the multiplexer being coupled from an output of the programmable divider.

* * * * *